(12) United States Patent
Fritzinger et al.

(10) Patent No.: US 6,197,699 B1
(45) Date of Patent: Mar. 6, 2001

(54) IN SITU DRY CLEANING PROCESS FOR POLY GATE ETCH

(75) Inventors: Larry B. Fritzinger; Cynthia C. Lee, both of Orlando; Edward M. Middlebrook, Kissimmee; John M. Sniegowski, Windermere, all of FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/009,399

(22) Filed: Jan. 20, 1998

(51) Int. Cl.[7] ........................................... H01H 1/00
(52) U.S. Cl. ..................... 438/710; 438/711; 438/714; 438/732
(58) Field of Search ................... 438/706, 707, 438/710, 714, 711, 732

(56) References Cited

U.S. PATENT DOCUMENTS

| | | | |
|---|---|---|---|
| 5,456,796 | * 10/1995 | Gupta et al. | 156/643.1 |
| 5,700,741 | * 12/1997 | Liao | 438/723 |
| 5,756,400 | * 5/1998 | Ye et al. | 438/710 |
| 5,868,852 | * 2/1999 | Johnson et al. | 134/1.1 |

OTHER PUBLICATIONS

Wolf S., "Silicon Processing for the VLSI Era", vol. 1, pp. 539–542.*

Applied Materials, Inc.; Polysilicon/Polycide Etch Phase 2 Process Kit and Consumables Guide (150mm); 1992; pp.1–4.

* cited by examiner

Primary Examiner—Felisa Garrett
Assistant Examiner—Vanessa Perez-Ramos

(57) ABSTRACT

The present invention provides a method for cleaning a contaminated chamber used in the manufacture of semiconductor devices. In one embodiment, the method comprises the steps of injecting, under pressure, a gas mixture of a fluorine-containing gas and an inert gas into the contaminated chamber, radiating the contaminated chamber with a radio frequency during the step of injecting, and removing volatile by-products or solid particulates from the contaminated chamber by performing pump-purge cycles within the contaminated chamber.

30 Claims, 4 Drawing Sheets

| STEP NUMBER | 210 | 220 | 230 | 240 | 250 | 260 | 270/275 | 280/285/287 | ... |
|---|---|---|---|---|---|---|---|---|---|
| STEP NAME | GAS INJECTION | PRESSURE STABILIZATION | RF/MAGNETIC FIELD APPLICATION | PURGING | PUMPING | DECISION | HIGH PRESSURE SEASON | LOW PRESSURE SEASON | |
| CHAMBER SELECTION | ALL | ALL | ALL | ALL | ALL | | ALL | ALL | |
| STEP END CONTROL | BY TIME | BY TIME | BY TIME | PRESSURE> 800mT | BY TIME | | BY TIME | BY TIME | |
| MAXIMUM STEP TIME | 10.0 SECONDS | 300.0 SECONDS | 0 SECONDS | 30.0 SECONDS | 5.0 SECONDS | | 60 SECONDS | 60 SECONDS | |
| ENDPOINT SELECTION | NO ENDPOINT | NO ENDPOINT | NO ENDPOINT | NO ENDPOINT | NO ENDPOINT | | NO ENDPOINT | NO ENDPOINT | |
| PRESSURE | SERVO 400 mT | SERVO 400 mT | SERVO 50 mT | THROTTLE CLOSED | THROTTLE FULLY OPEN | | SERVO 300 mT | SERVO 20 mT | |
| PRESSURE RAMP RATE | 0 | 0 | 0 | 0 | 0 | | 0 | 0 | |
| RF POWER, MATCH, MODE | 0W, AUTO, B-TO-B | 400W, AUTO, B-TO-B | 400W, AUTO, B-TO-B | 0W, AUTO, B-TO-B | 0W, AUTO, B-TO-B | | 300W, AUTO, B-TO-B | 240W, AUTO, B-TO-B | |
| RF TUNE SETPOINT | 0.0 V | 0.0 V | 0.0 V | 0.0 V | 0.0 V | | 0.0 V | 0.0 V | |
| DC BIAS LIMIT | -1000 TO 0 VOLT | -1000 TO 0 VOLT | -1000 TO 0 VOLT | -1000 TO 0 VOLT | -1000 TO 0 VOLT | | -1000 TO 0 VOLT | -1000 TO 0 VOLT | |

| STEP NAME | GAS INJECTION | PRESSURE STABILIZATION | RF/MAGNETIC FIELD APPLICATION | PURGING | PUMPING | DECISION | HIGH PRESSURE SEASON | LOW PRESSURE SEASON |
|---|---|---|---|---|---|---|---|---|
| MAGNET FIELD | 0 GAUSS | 0 GAUSS | 40 GAUSS | 0 GAUSS | 0 GAUSS | | 0 GAUSS | 40 GAUSS |
| MAGNET MODULATION | PRGRM | PRGRM | PRGRM | PRGRM | PRGRM | | PRGRM | PRGRM |
| DEGREE OF MODULATION | – | – | – | – | – | | – | – |
| MAGNET ROTATION FREQ | –Hz | –Hz | –Hz | –Hz | –Hz | | –Hz | –Hz |
| PROCESS POSITION | PROCESS | PROCESS | PROCESS | PROCESS | PROCESS | | PROCESS | PROCESS |
| $SF_6$ | 90 scc | 90 scc | 75 scc | – | – | | – | – |
| $N_2$ | 25 scc | 25 scc | | 250 scc | –1 PU | | – | – |
| $Cl_2$ | – | – | – | – | – | | 70 scc | 30 scc |
| HBr | – | – | – | – | – | | 70 scc | 30 scc |

IN SITU DRY CLEANING PROCESS FOR POLY GATE ETCH

TECHNICAL FIELD OF THE INVENTION

The present invention is directed, in general, to a method of cleaning a contaminated chamber in which a semiconductor manufacturing process is conducted, and, more specifically, to an in situ dry cleaning method for a poly gate etch using a gas mixture comprising a fluorine-containing gas and an inert gas.

BACKGROUND OF THE INVENTION

Semiconductor wafer manufacture today demands ever cleaner environments. Any contamination within the clean room, especially within the process chamber becomes a threat to the profitability of the company in the highly competitive semiconductor manufacturing business. It is a common objective within the industry to strive for a Zero Defect density, $D_0$. The etching process is one very critical area during which significant contaminants are created in semiconductor manufacturing.

In a plasma etching process, the wafer within a chamber is subjected to a chemical plasma and radio frequency energy is used to catalyze the process. A glow discharge is used to produce chemically reactive substances (atoms, ions, etc.) from a relatively inert molecular gas. These substances then react chemically to remove (etch) the unprotected areas of the target wafer. The very nature of the etching process removes material from the wafer and suspends the by-products in the atmosphere within the processing chamber. These by-products will deposit on virtually any surface available. Although evacuation of the chamber removes the vast majority of etching waste products, some material will inevitably deposit on the surfaces of the chamber itself. Over time, significant deposits accumulate to present a contamination hazard when the deposits flake off and land on the silicon wafer. Even the smallest amount of contamination, in the expensive semiconductor manufacturing process, results in lost time and product rejection. The objective is to have absolutely no contamination on the semiconductor device to interfere with the operation and reliability of the integrated circuits. To combat this, etch chamber manufacturers have prescribed preventive maintenance (cleaning) intervals and procedures. A major objective of the cleaning process is to assure that the environment in the chamber remains as constant as is economically possible, so that each wafer is processed exactly the same as the previous wafer. As contaminants accumulate within the chamber, the consistency of the semiconductor devices from batch to batch is jeopardized.

One manufacturer, Applied Materials, Inc., prescribes a "wet clean" every 3000 wafers processed within their Precision 5000 Mark II chamber. A wet clean requires two certified persons to disassemble the chamber and to literally scrub the accumulated contaminants from the surfaces of the chamber parts with a liquid solvent. This physical cleaning and reassembly is estimated to consume five hours (i.e., 10 manhours) for each chamber, plus one hour for evacuation/pump down, plus two hours for process/particle qualification (seasoning) before production can be resumed. Thus the chamber is out of the production line for preventive maintenance for a minimum of eight clock hours for every 3000 wafers processed. In actual practice, cleaning, seasoning and requalification can easily take as much as 24 clock hours.

The manufacturer's standard of preventive maintenance of a wet clean after every 3000 wafers for the Precision 5000 Mark II chamber is based upon a typical process of etching 0.4 $\mu$m polysilicon with 30% overetch (approximately 2 plasma minutes/wafer). Because actual preventive maintenance frequency will differ based upon the particular manufacturing application, radio frequency (RF) hours have been used to track the extent of usage of the chamber. An RF meter measures the cumulative processing, and wet cleans have typically been performed at 40 to 60 RF hours, but also as high as 80 RF hours. In some instances, a special sampling wafer with a known number of particles on it, is placed in the chamber, tested, removed and then the number of additional particles are counted. A standard for particle accumulation is applied, and the decision to wet clean or not to wet clean is made. Regardless, this testing consumes valuable production time. Thus the prior art has relied primarily upon the experience of the operators to dictate the time for wet cleaning before manufacturing process degradation occurs. However, this empirical method is not extremely reliable.

Prior art in situ cleaning processes have been developed in an effort to extend the mean time between cleanings (MTBC). In these processes, the plasma consists of specialized gases under the influence of RF energy that subjects the interior of the chamber to a cleaning action by reacting with the contaminants and removing them by evacuation. One in situ method employs a combination of a fluorinator, typically sulfur hexafluoride $SF_6$ and oxygen $O_2$. However, a side effect of this method of in situ cleaning is that the oxygen in the cleaning plasma attacks the specialty plastics, specifically the Vespel parts in the case of the Applied Materials Precision 5000 Mark II. Vespel, as with most plastics, is a hydrocarbon-based plastic and in the presence of oxygen, the Vespel deteriorates (oxidizes). Running this dry clean process is actually destroying some of the chamber parts and thus adds to the contamination problem. As the Vespel parts of the chamber deteriorate, this also increases the maintenance costs of the chamber when the damaged parts have to be replaced.

Accordingly, what is needed in the art is a method for cleaning a contaminated chamber used in the manufacture of semiconductor devices which removes substantially all of the accumulated etch by-products while minimizing damage to the etch chamber parts.

SUMMARY OF THE INVENTION

To address the above-discussed deficiencies of the prior art, the present invention provides a method for cleaning a contaminated chamber used in the manufacture of semiconductor devices. In one embodiment, the method comprises the steps of injecting, under pressure, a gas mixture of a fluorine-containing gas and an inert gas into the contaminated chamber, radiating the contaminated chamber with a radio frequency during the step of injecting, and removing volatile by-products or solid particulates from the contaminated chamber by performing pump-purge cycles within the contaminated chamber. In an alternative embodiment, the method may further comprise the step of subjecting the chamber to a magnetic field subsequent to the injecting and radiating steps.

In one advantageous embodiment, the step of injecting a gas mixture includes the step of injecting fluorine-containing gas is sulfur hexafluoride ($SF_6$). Alternatively, the gas mixture may be selected from the group consisting of carbon tetrafluoride ($CF_4$), ethylhexafluoride ($C_2F_6$), nitrogen trifluoride ($NF_3$), octafluorocyclobutane ($C_4F_8$), and trifluoromethane ($CHF_3$). The inert gas may include those commonly known inert gases such as nitrogen, helium, xenon, argon, krypton, or radon. In one particular embodiment, however, the inert gas is nitrogen ($N_2$), or alternatively may be helium (He).

In another embodiment, the step of radiating includes radiating the contaminated chamber with a radio frequency (RF) at a power two times that which is used during an etching process conducted on the semiconductor device. In some particularly useful embodiments, the RF power may range from about 150 watts to 600 watts.

In another embodiment, the method further comprises the step of seasoning the chamber using a production chemistry used in the manufacture of the semiconductor devices subsequent to the removing step. In such instances, the present invention provides a convenient insitu process for cleaning the chamber in between batches to provide an essentially contaminant free chamber in which to etch the next batch of semiconductor wafers.

In one particularly advantageous embodiment, the step of injecting includes injecting the gas mixture into the contaminated chamber at a pressure ranging from about 100 milliTorr to about 800 milliTorr. In yet another embodiment, the step of performing pump-purge cycles includes the steps of performing from about 10 to about 40 insitu pump-purge cycles and increasing the pressure to a pressure ranging from about 400 milliTorr to about 1000 milliTorr.

In some embodiments, the step of performing the pump-purge cycles includes the step of also flowing the inert gas into the contaminated chamber during the pump-purge cycle. In such embodiments, the step of performing pump-purge cycle includes the step of pumping the inert gas for a period of time ranging from about 3 seconds to about 10 seconds or until a base pressure on the order of one (1) to five (5) millitorr is reached.

In yet another aspect of the present invention, there is provided a method of manufacturing a plurality of semiconductor devices, comprising the steps of etching a plurality of semiconductor devices with a predetermined etching chemistry within an etching chamber where the etching contaminates the etching chamber, and cleaning the etching chamber subsequent to the step of etching. In this particular embodiment, the cleaning step includes the steps of injecting a gas mixture of a fluorine-containing gas and an inert gas into the contaminated chamber at a pressure ranging from about 100 milliTorr to about 800 milliTorr where the gas is substantially free of oxygen, radiating the contaminated chamber with a radio frequency during the step of injecting at a power two times that which is used during an etching process conducted on the semiconductor device, removing volatile by-products or solid particulates from the contaminated chamber by performing pump-purge cycles within said contaminated chamber, and flowing the inert gas into the contaminated chamber during the step of removing.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 3 illustrates one embodiment of a chamber cleaning recipe for use with the flow diagram of FIG. 2.

DETAILED DESCRIPTION

Figure 1:
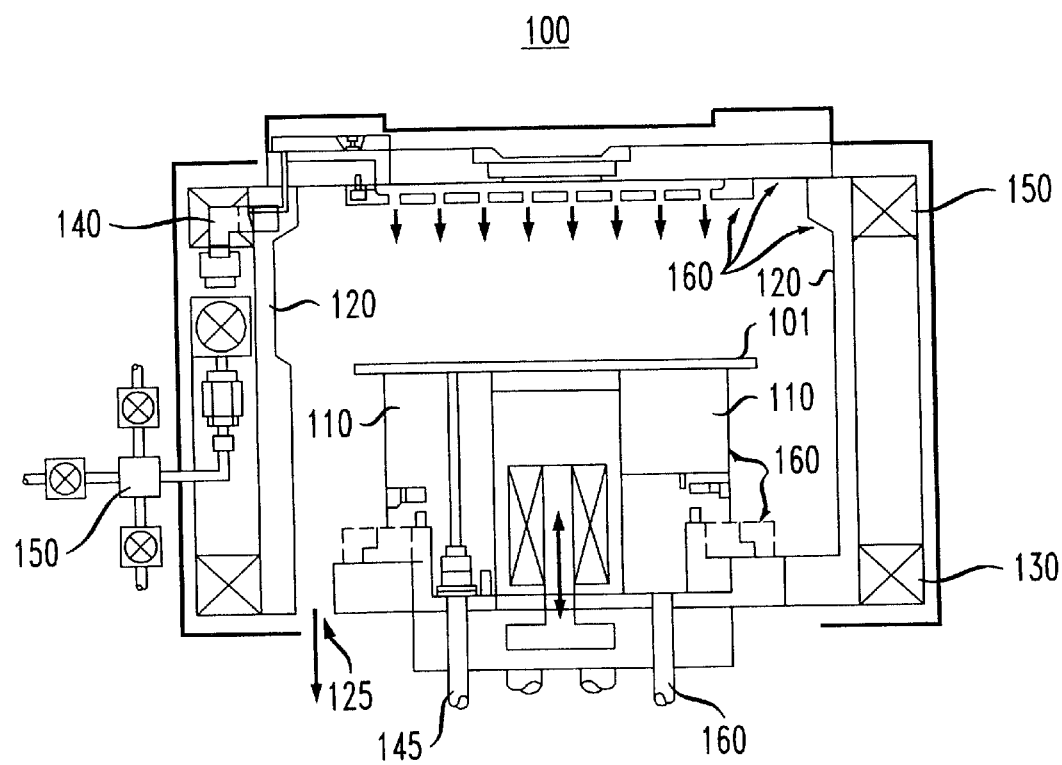
FIG. 1 illustrates a schematic of one embodiment of an etch chamber used in the manufacture of semiconductor devices.

Referring initially to FIG. 1, illustrated is a schematic of one embodiment of an etch chamber used in the manufacture of semiconductor devices. A chamber, generally designated 100, comprises an air-tight environment in which an electrically charged cathode 110 supports a semiconductor wafer 101 for an etch process. One skilled in the art will recognize that the chamber may be any of: (a) a standard diode-type reactor (with or without magnetic field), (b) a high density etcher with a plurality of inductively coupled power sources, or (c) any other type of semiconductor etch chamber. Chamber walls 120 comprise the system anode. Magnet coils 140 control the magnetic field within the chamber 100 depending upon the recipe for the process. Prior to etching a semiconductor wafer 101, the chamber 100 is evacuated to a low vacuum through a vacuum port 125. A process gas (production chemistry—a mixture specifically designed for the etch process) is injected into the chamber 100 under pressure through the process gas inlet 140. In the illustrated embodiment, the chamber 100 is equipped with a gas manifold 150 prior to the process gas inlet 140 to permit mixing of process gasses. Radio frequency (RF) energy is transmitted into the chamber 100 by way of the RF inlet 160. If required for the process recipe, an inert gas may be injected through the inert gas inlet 145. During the etch processing, material is eroded from the surface of the semiconductor wafer 101 through an ion-assisted chemical reaction. Those skilled in the art will understand that the erosion is controlled by methods and processes which do not affect the scope and intent of the present invention. The etch by-products are primarily removed through the vacuum port 125. However, some etch by-products adhere to the interior surfaces 160 of the chamber 100 in a random fashion. As subsequent wafers 101 are processed, additional by-products adhere to the interior surfaces 160 and previous deposits grow in size when they act as deposition nuclei. When a predetermined number of RF hours has expired, physical cleaning of the chamber 100 is required as preventive maintenance.

Figure 2:
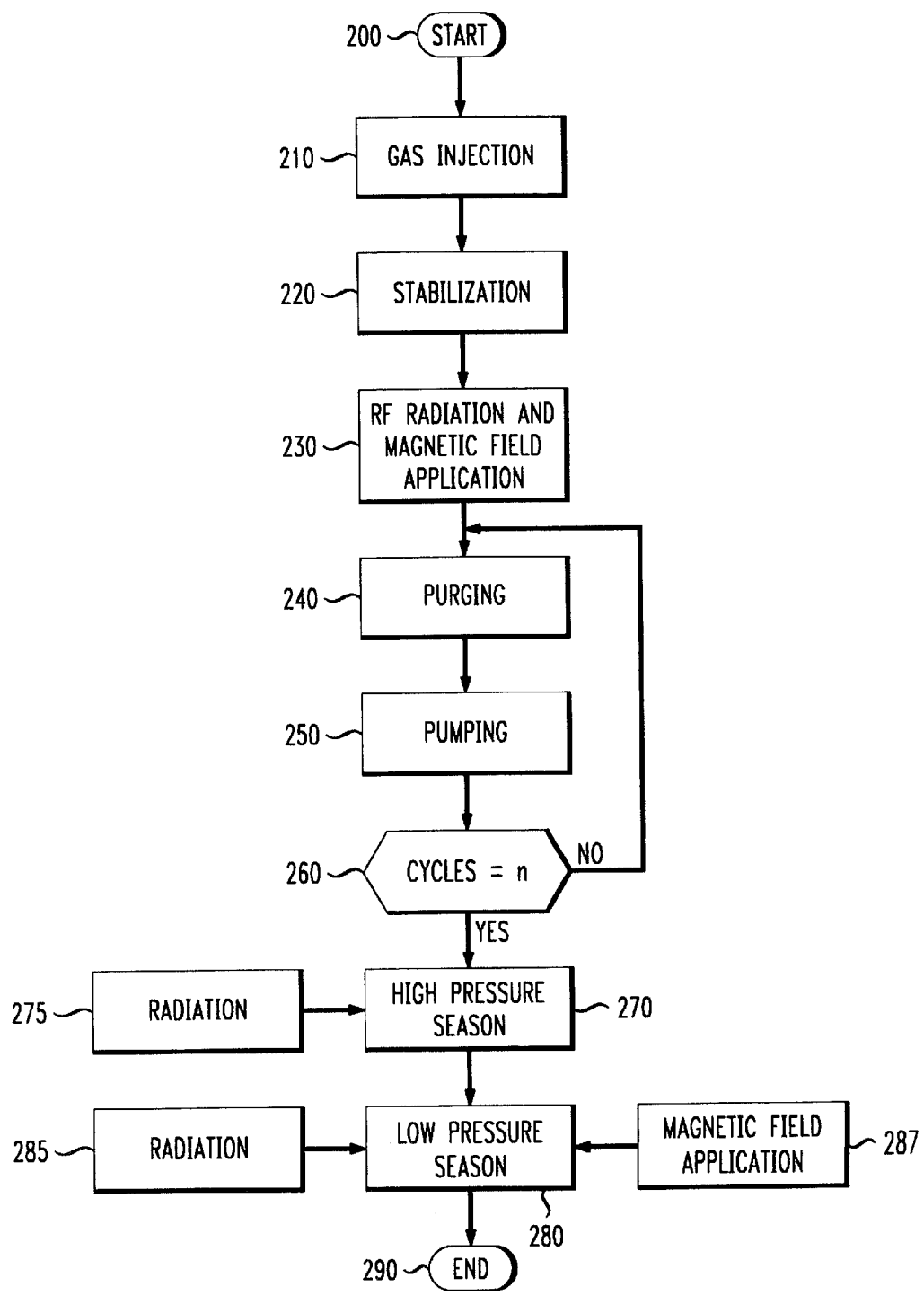
FIG. 2 illustrates a flow diagram of one embodiment of an in situ cleaning process organized according to the principles of the present invention.

Referring now to FIG. 2, illustrated is a flow diagram of one embodiment of an in situ cleaning process organized according to the principles of the present invention. Referring now to FIG. 3, illustrated is one embodiment of a chamber cleaning recipe for use with the flow diagram of FIG. 2. Refer now to FIGS. 1, 2 and 3 as required. Following removal of the processed wafer 101 from the chamber 100, the in situ cleaning process begins at a start step 200. At the first action step 210, a gas mixture of a fluorine-containing gas and an inert gas, being substantially free of oxygen, is injected under pressure into the contaminated chamber 100. At step 220, the contaminated chamber 100 is stabilized at a pressure of 400 milliTorr with the gas mixture of a fluorine-containing gas and an inert gas. In the preferred embodiment (see FIG. 3), the fluorine-containing gas is sulfur hexafluoride ($SF_6$) and the inert gas is nitrogen (N). In an alternative embodiment, the fluorine-containing gas may be selected from among: carbon tetrafluoride ($CF_4$), ethylhexafluoride ($C_2F_6$), nitrogen trifluoride ($NF_3$), octafluorocyclobutane ($C_4F_8$), and trifluoromethane ($CHF_3$). In any of the aforementioned embodiments, another inert gas, such as helium (He) may be substituted for nitrogen ($N_2$) if so desired.

In one advantageous embodiment, the gas mixture is mixed external to the contaminated chamber 100 at the manifold 150 prior to the process gas inlet 140. The gas mixture is then injected at a pressure ranging from about 100 milliTorr to about 800 milliTorr through the process gas inlet 140. In an alternative embodiment, the fluorine-containing gas is injected through the process gas inlet 140 simultaneous with the injection of nitrogen gas through the inert gas inlet 145.

Step 225 involves, simultaneously with step 220, radiating the chamber with radio frequency energy. In the preferred embodiment of step 225 the power level of the radiation (ranging from about 150 watts to about 600 watts) is two (2) times the power level used during semiconductor wafer processing. However, those skilled in the art will understand that the RF radiation power level may be varied from the described embodiment without departing from the broadest scope of the present invention.

In the illustrated embodiment of FIG. 2, following injection 220 and radiation 225, step 230 involves subjecting the chamber 100 to a magnetic field through application of power to the magnet coils 130. Preferably, the chamber 100 is subjected to the magnetic field subsequent to the steps of injection 220 and radiation 225. At step 240 the chamber 100 is filled with nitrogen ($N_2$) without pumping until a threshold pressure of about 400 milliTorr to about 1000 milliTorr is reached. At step 250 the nitrogen ($N_2$) purge gas is shut off and the chamber 100 is pumped for 3 to 10 seconds or until a base pressure less than 5 milliTorr is achieved. At step 260, a test is made to determine the number of times that pumping step 250 has been accomplished. If the number of pumping cycles is not equal to a prescribed number n, the system is returned to repeat purging step 240. The prescribed number of cycles n of pumping step 250 ranges from 10 to 40 times. As each cycle is completed, volatile by-products and solid particulates of the previous manufacturing process and the in situ cleaning step just completed are removed from the chamber 100. When the number of pumping cycles is equal to the prescribed number n, the system advances to step 270.

At high pressure seasoning step 270, the production chemistry is introduced to the chamber 100 through the process gas inlet 140 at a pressure on the order of 300 milliTorr. Simultaneous with step 270, radiation step 275 applies RF power on the order of 150 percent of production power through the RF input 160. In the illustrated embodiment of step 275, RF power is applied for 60 seconds. The system then advances to low pressure seasoning step 280 which involves introducing the production chemistry through the process gas inlet 140 at a pressure on the order of 20 milliTorr. Simultaneous with step 280, radiation step 285 applies RF power on the order of 100 percent of production power through the RF input 160. In the illustrated embodiment, RF power is applied for 60 seconds during step 285. Simultaneous with steps 280 and 285, magnetic field application step 287 involves subjecting the chamber 100 to a magnetic field through application of power to the magnet coils 130.

Although this description and the illustrated embodiment specify RF power settings, magnetic field density, step timing, plasma composition, etc., those skilled in the art will understand that changes may be made to these factors while remaining within the broadest scope and intent of the present invention.

Upon completion of step 280 the cleaning process is considered complete, the chamber is ready to resume semiconductor wafer production, and the method concludes at the end step 290.

Experience with the aforedescribed in situ cleaning process has shown that the mean time between wet cleans can easily be increased to 200 RF hours as compared to 50 RF hours without the in situ cleaning process. When an in situ plasma clean is performed after every wafer batch, a plasma clean requires 10 RF minutes. With an etch process time of about 32.5 RF minutes, each semiconductor batch with cleaning consumes 42.5 RF minutes (0.708 RF hours). Therefore, in 200 RF hours of operation 282 semiconductor batches are processed. At 10 RF minutes per cleaning times 282 batches, the total plasma clean time between wet cleans is now 2820 minutes (47 hours) of RF time. Thus, the total system down time for cleaning for 200 RF hours is reduced from approximately 96 hours (4 cleans times 24 hours per clean) to approximately 47 hours.

While those skilled in the art will recognize that the plasma gas mixture may not be completely oxygen free, the effect of oxygen in the cleaning process and thus chamber part replacements due to oxidation have been effectively eliminated. From the foregoing it can be seen that the present invention provides a method for cleaning a contaminated chamber used in the manufacture of semiconductor devices. In one embodiment, the method comprises the steps of injecting, under pressure, a gas mixture of a fluorine-containing gas and an inert gas into the contaminated chamber, radiating the contaminated chamber with a radio frequency during the step of injecting, and removing volatile by-products or solid particulates from the contaminated chamber by performing pump-purge cycles within the contaminated chamber.

Additionally, the present invention provides a method of manufacturing a plurality of semiconductor devices and semiconductor materials, comprising the steps of etching a plurality of semiconductor devices with a predetermined etching chemistry within an etching chamber where the etching contaminates the etching chamber, and cleaning the etching chamber subsequent to the step of etching. In this particular embodiment, the cleaning step includes the steps of injecting a gas mixture of a fluorine-containing gas and an inert gas into the contaminated chamber at a pressure ranging from about 100 milliTorr to about 800 milliTorr where the gas is substantially free of oxygen, radiating the contaminated chamber with a radio frequency during the step of injecting at a power two times that which is used during an etching process conducted on the semiconductor device, removing volatile by-products or solid particulates from the contaminated chamber by performing pump-purge cycles within said contaminated chamber, and flowing the inert gas into the contaminated chamber during the step of removing.

Although the present invention has been described in detail, those skilled in the art should understand that they can make various changes, substitutions and alterations herein without departing from the spirit and scope of the invention in its broadest form.

What is claimed is:

1. A method for cleaning a contaminated chamber used in the manufacture of a semiconductor device, comprising:

injecting, under pressure, a cleaning gas mixture of a fluorine-containing gas and an inert gas into said contaminated chamber;

radiating said contaminated chamber with a radio frequency during said injecting; and removing volatile by-products or solid particulates from said contaminated chamber by performing pump-purge cycles within said contaminated chamber and flowing said inert gas into said contaminated chamber.

2. The method as recited in claim 1 further comprising seasoning said chamber using a production chemistry used to etch a substrate of said semiconductor device subsequent to said removing.

3. The method as recited in claim 1 wherein said injecting includes injecting said gas mixture into said contaminated chamber at a pressure ranging from about 100 milliTorr to about 800 milliTorr.

4. The method as recited in claim 1 wherein said performing pump-purge cycles includes performing from about 10 to about 40 insitu pump-purge cycles and increasing said pressure to a pressure ranging from about 400 milliTorr to about 1000 milliTorr.

5. The method as recited in claim 1 wherein performing a pump-purge cycle includes pumping said inert gas for a period of time ranging from about 3 seconds to about 10 seconds or until a base pressure is reached.

6. The method as recited in claim 1 wherein injecting a gas mixture includes injecting a fluorine-containing gas wherein said fluorine-containing gas is sulfur hexafluoride ($SF_6$).

7. The method as recited in claim 1 wherein said injecting a gas mixture includes injecting a fluorine-containing gas selected from the group consisting of:
carbon tetrafluoride ($CF_4$),
ethylhexafluoride ($C_2F_6$),
nitrogen trifluoride ($NF_3$),
octafluorocyclobutane ($C_4F_*$), and
trifluoromethane ($CBF_3$).

8. The method as recited in claim 1 wherein said injecting said inert gas includes injecting nitrogen ($N_2$).

9. The method as recited in claim 1 wherein said injecting said inert gas includes injecting helium (He).

10. The method as recited in claim 1 wherein said radiating includes radiating said contaminated chamber with a radio frequency at a power two times that which is used during an etching process conducted on said semiconductor device.

11. The method as recited in claim 10 wherein said power ranges from about 150 watts to about 600 watts.

12. The method as recited in claim 1 wherein said method further comprises subjecting said chamber to a magnetic field subsequent to said injecting and radiating.

13. A method for cleaning a contaminated chamber used in the manufacture of a semiconductor device, comprising:
injecting a gas mixture of a fluorine-containing gas and an inert gas into said contaminated chamber at a pressure ranging from about 100 milliTorr to about 800 milliTorr;
radiating said contaminated chamber with a radio frequency during said injecting at a power two times that which is used during an etching process conducted on said semiconductor device;
removing volatile by-products or solid particulates from said contaminated chamber by performing pump-purge cycles within said contaminated chamber; and
flowing said inert gas into said contaminated chamber during said removing.

14. The method as recited in claim 13 further comprising seasoning said chamber using an etching chemistry used to etch a substrate of said semiconductor device subsequent to said removing.

15. The method as recited in claim 13 wherein said performing pump-purge cycles includes performing from about 10 to about 40 insitu pump purge cycles and increasing said pressure to a pressure ranging from about 400 milliTorr to about 1000 milliTorr.

16. The method as recited in claim 13 wherein said performing pump-purge cycle includes pumping said inert gas for a period of time ranging from about 3 seconds to about 10 seconds or until a base pressure is reached.

17. The method as recited in claim 13 wherein injecting a gas mixture includes injecting a fluorine-containing gas wherein said fluorine-containing gas is sulfur hexafluoride ($SF_6$).

18. The method as recited in claim 14 wherein said injecting a gas mixture includes injecting a fluorine-containing gas selected from the group consisting of:
carbon tetrafluoride ($CF_4$),
ethylhexafluoride ($C_2F_6$),
nitrogen trifluoride ($NF_3$),
octafluorocyclobutane ($C_4F_8$), and
trifluoromethane ($CHF_3$).

19. The method as recited in claim 13 wherein said injecting said inert gas includes injecting nitrogen ($N_2$).

20. The method as recited in claim 13 wherein said injecting said inert gas includes injecting helium (He).

21. The method as recited in claim 13 wherein said power ranges from about 150 watts to about 600 watts.

22. The method as recited in claim 13 wherein said method further comprises subjecting said chamber to a magnetic field subsequent to said injecting and radiating.

23. A method of manufacturing a semiconductor device, comprising:
etching a substrate of said semiconductor device with an etching chemistry within an etching chamber, said etching contaminating said etching chamber; and
cleaning said etching chamber subsequent to said etching, said cleaning including:
injecting a gas mixture of a fluorine-containing gas and an inert gas into said contaminated chamber at a pressure ranging from about 100 milliTorr to about 800 milliTorr;
radiating said contaminated chamber with a radio frequency during said injecting at a power two times that which is used during an etching process conducted on said semiconductor device;
subjecting said chamber to a magnetic field;
removing volatile by-products or solid particulates from said contaminated chamber by performing pump-purge cycles within said contaminated chamber; and
flowing said inert gas into said contaminated chamber during said removing.

24. The method as recited in claim 23 further comprising seasoning said chamber using said etching chemistry subsequent to said removing.

25. The method as recited in claim 23 wherein said performing pump-purge cycles includes performing from about 10 to about 40 insitu pump-purge cycles and increasing said pressure to a pressure ranging from about 400 milliTorr to about 1000 milliTorr.

26. The method as recited in claim 23 wherein said performing pump-purge cycle includes pumping said inert gas for a period of time ranging from about 3 seconds to about 10 seconds or until a base pressure is reached.

27. The method as recited in claim 23 wherein said injecting a gas mixture includes injecting fluorine-containing gas is sulfur hexafluoride ($SF_6$).

28. The method as recited in claim 23 wherein said injecting a gas mixture includes injecting a fluorine-containing gas selected from the group consisting of:

carbon tetrafluoride ($CF_4$), ethylhexafluoride ($C_2F_6$), nitrogen trifluoride ($NF_3$), octafluorocyclobutane ($C_4F_8$), and trifluoromethane ($CHF_3$).

29. The method as recited in claim 23 wherein said injecting said inert gas includes injecting nitrogen ($N_2$).

30. The method as recited in claim 23 wherein said injecting said inert gas includes injecting helium (He).

* * * * *